United States Patent [19]

Maeda et al.

[11] Patent Number: 5,134,459
[45] Date of Patent: Jul. 28, 1992

[54] LEAD FRAME FOR SEMICONDUCTOR DEVICE

[75] Inventors: Takao Maeda; Tomohiko Ihara; Masaharu Yasuhara; Shosaku Yamanaka, all of Hyogo, Japan

[73] Assignee: Sumitomo Electric Industries, Ltd., Osaka, Japan

[21] Appl. No.: 623,668

[22] PCT Filed: Apr. 26, 1990

[86] PCT No.: PCT/JP90/00549
§ 371 Date: Mar. 1, 1991
§ 102(e) Date: Mar. 1, 1991

[87] PCT Pub. No.: WO90/13914
PCT Pub. Date: Nov. 15, 1990

[30] Foreign Application Priority Data

May 1, 1989 [JP] Japan .................. 1-511882[U]
May 1, 1989 [JP] Japan .................. 1-511883[U]

[51] Int. Cl.⁵ .................................. H01L 23/48
[52] U.S. Cl. ........................... 357/70; 357/72
[58] Field of Search ........................ 357/70, 72

[56] References Cited

U.S. PATENT DOCUMENTS 5,010,388 4/1991 Sasame et al. ............... 357/70

FOREIGN PATENT DOCUMENTS 0113255 9/1979 Japan .................. 357/70
0140160 6/1986 Japan .................. 357/70

*Primary Examiner*—Georgia Y. Epps
*Attorney, Agent, or Firm*—Wenderoth, Lind & Ponack

[57] ABSTRACT

A lead frame for a high-density, sealed type of semiconductor device having many input/output pins and capable of high-speed operation is made of a magnetic material with a covering layer of a non-magnetic metal. The covering layer covers a top surface, a bottom surface, both side surfaces and an inner end face of a portion of the leads of the lead frame which is to be sealed in a semiconductor package. The covering layer has a thickness of 1 micron or more at both side surfaces of each lead. Therefore, the inductance at the leads can be reduced remarkably. Thus, the semiconductor can be operated at a high speed with improved reliability.

10 Claims, 1 Drawing Sheet

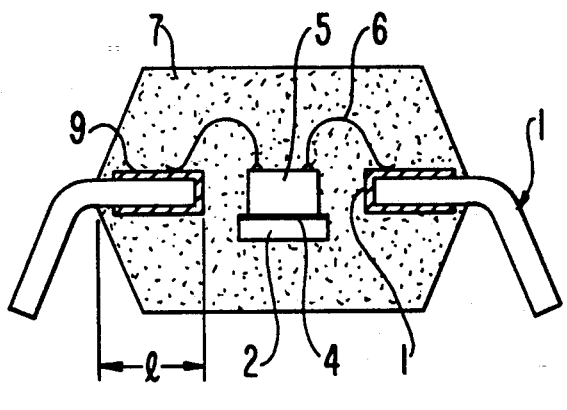
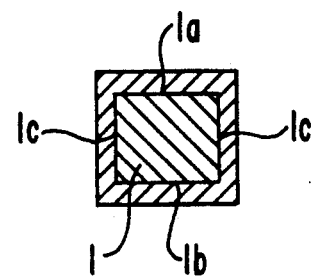
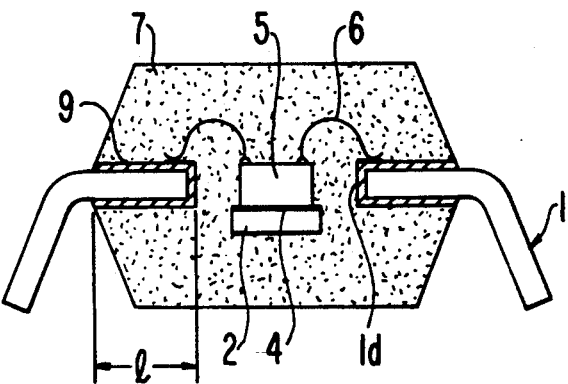
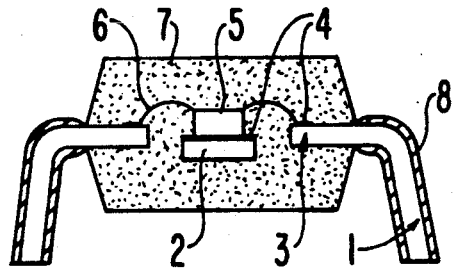
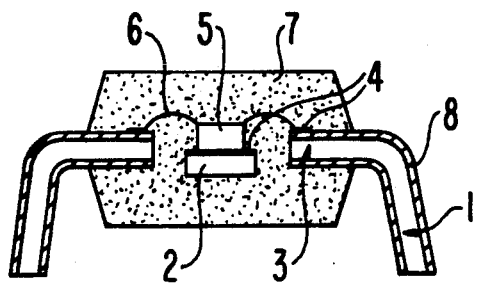

LEAD FRAME FOR SEMICONDUCTOR DEVICE

BACKGROUND OF THE INVENTION

This invention relates to a resin-sealed, high-density semiconductor device having a large number of input-/output pins (leads) and capable of operating at high speed.

A semiconductor device (or chip) having predetermined functions is generally sealed in a package by hermetic sealing or resin sealing methods for maintaining the stability of its characteristics, thermal or electrical for providing insulation between electrodes and for facilitating its of transportation and handling.

A package most often used for this purpose is a resin-sealed type. This is due to the fact that this type of package is superior in terms of its mass-production as well as from an economical viewpoint with respect to metal or ceramic packages and that its reliability and utility are better as a result of various improvements.

On the other hand, a glass-sealed type, mainly made of ceramics, has as good of heat dissipation properties and hermetic tightness as multi-layered ceramic packages (MLCP) and thus it is suitable for enveloping chips which handle high-speed signals or chips whose heat buildup is remarkable. Furthermore, it is cheaper to manufacture than an MLCP. In particular, it has an advantage that a large number of leads can be provided because its four sides can be used, and it is used increasingly to meet the requirements microcomputers of having thinner chips.

Lead frame materials currently used for these packages can be classified into an Fe-Ni group, a Cu group, an Fe group and so on. Of the above three groups, the Fe-Ni group material is preferred, depending on use, especially if high reliability is required for the IC's themselves.

The Fe-Ni group lead frames are ordinarily covered with a metal film to facilitate assembling such as chip bonding and wire bonding. Such a film is of gold or silver in the resin-sealed type of semiconductor device and aluminum in the glass-sealed type. These materials are used selectively taking into account the degree of reliability required for IC's, the manner in which Si chips are mounted, and the cost.

Next, the prior art will be described, taking the resin-sealed type as an example.

FIGS. 4 and 5 show sections of a conventional resin-sealed type of semiconductor device (IC package). As shown in the figures, gold or silver films 4 are formed on a die pad portion 2 and inner pad portions 3 of a lead frame 1 in a spot-like manner. This IC package is made by mounting a semiconductor element such as an Si chip 5 on the die pad portion 2 through the film 4, electrically connecting the chip 5 and the inner pad portions 3 of the lead frame by means of gold wires 6, and by forming a resin seal 7. To assure good bonding properties of the chip 5 and the wires 6, the metal film 4 is provided only on locations at which the wires and chip are bonded to the lead frame.

Numeral 8 designates a plating layer of tin or solder formed on the surface of an outer lead. This plating layer 8 is provided because if the lead frame is made of an Fe-Ni alloy or the like, its wettability with solder or the like is extremely bad and it is necessary to solder the frame to a printed circuit board or the like with high reliability.

Since a lead made of an Fe-Ni alloy is magnetic its self-inductance tends to be large during use of the device. Especially in the case of a high-density semiconductor device having a greater number of input and output pins, the lead portion inside the resin tends to be long and thus the self-inductance increases remarkably. This will hamper high-speed operation of the semiconductor device.

SUMMARY OF THE INVENTION

It is an object of this invention to provide a lead frame for a semiconductor device which obviates the above-said shortcomings.

Specifically, an object of the present invention is to provide a lead frame in which the inductance of the lead can be reduced remarkably. For example, a lead frame made leads of an Fe-42%Ni alloy and having a thickness of 0.15 mm and a lead width of 0.2-0.12 mm has inductance values as shown in Table 1. The aluminum layer used was 5-10 microns thick at top and bottom of the lead frame.

As is apparent from Table 1, when the aluminum layer is less than 1 micron thick at both side surfaces of the leads it hardly serves to reduce the inductance. But when it is 1 micron thick or more, its effect increases remarkably.

For normal operation of a high-density integrated circuit, the inductance of the lead frame should be kept to 60 nH or less. In view of this, the effect of the present invention will be exhibited most remarkably if the length of the unexposed portion of the lead frame is 10 mm or more or if the lead frame is made of a material whose inductance tends to increase easily. The lead frame may be of an iron-nickel alloy of 38-55 percent by weight nickel, or of an iron-nickel-cobalt alloy of 25-35 percent by weight nickel and 15-25 percent by weight cobalt.

Therefore in the preferred embodiment, the lead frame is covered at its unexposed portion with aluminum. But it was found that the self-inductance can be reduced effectively when the unexposed lead portion is covered with any other non-magnetic metal having a good electrical conductivity such as an aluminum alloy, copper, gold, silver, zinc, lead, tin or alloys thereof.

According to this invention, the covering layer of a non-magnetic metal having a good conductivity is provided over the top and bottom surfaces and side surfaces of the portion of the magnetic lead frame where it is not exposed while in use. Because the covering layer has a thickness of 1 micron or more at the sides of the leads, the inductance at the lead portion can be reduced remarkably. This makes it possible to improve the reliability of a high-density semiconductor device which has many input/output pins and is operated at a high speed.

BRIEF DESCRIPTION OF THE DRAWINGS

FIGS. 1 and 2 are sectional views of embodiments of a lead frame according to this invention showing one form of use therefor.

FIG. 3 is a sectional view of lead at the resin-sealed portion of the same;

FIGS. 4 and 5 are sectional views of a prior art resin-sealed type of semiconductor device.

DETAILED DESCRIPTION OF THE PREFERRED EMBODIMENTS

One embodiment of this invention will be described with reference to FIGS. 1 to 3.

The elements designated 1, 2 and 4–7 in FIGS. 1 and 2 are the same as those in FIGS. 4 and 5. The metal films 4 in FIG. 1 are made of silver whereas the films 4 in FIG. 2 are made of gold. In both of the embodiments, covering layers 9 made of a non-magnetic metal having a good conductivity are provided on the entire surfaces of the portion of the lead frame 1 covered with the resin seal 7 (excepting the die pad portion 2), i.e. top surface 1a, bottom surface 1b, both side surfaces 1c (FIG 3) and inner end faces 1d. In the first embodiment shown in FIG. 1, layers 9 are of aluminum whereas in the second embodiment shown in FIG. 2, they are of copper. Also, the covering layers 9 are one micron thick or more at the side surfaces 1c in both embodiments shown in FIGS. 1 and 2. Both in FIGS. 1 and 2, the plating layers of tin or solder on the outer leads are not shown.

Next, in order to verify the effects of the present invention, the following experiments were conducted.

EXPERIMENT 1

A 35 mm×35 mm flat mold package having the structure shown and having leads extending in four directions was prepared. The minimum lead length 1 at the sealed portion was 10 mm while the maximum length was 15 mm. The aluminum covering layers 9 shown in FIG. 1 were six microns thick at the top and bottom surfaces 1a, and 1b and one micron thick at the side surfaces 1c.

For comparison sake, a semiconductor device similar to the above device was prepared by use of a typical prior art lead frame (with aluminum coverings provided on only the top surfaces within the range of 3 mm from the end).

The inductance was measured for each of these devices. The inductance at 100 kHz was 80–125 nH with the prior art structure whereas with that of the specimen according to the present invention it was 28–42 nH, which is low enough to assure correct operation of the device.

EXPERIMENT 2

An Fe-42%Ni lead frame 0.2 mm wide and 0.1 mm thick with a length of the unexposed portion of 10 mm was prepared.

In this state, the inductance of this lead frame was 73 nH at 1 MHz. Then, this lead frame was covered with the an aluminum layer 9 having a thickness of 6 microns at top and bottom surfaces 1a, 1b and 1 micron at both side surfaces 1c. The inductance at 1 MHZ dropped to 12 nH.

The effects of this invention will be apparent from the results of these experiments.

In the drawings, the lead frame is used for a resin-sealed type of semiconductor device. But the same effects can be expected when it is used for a glass-sealed type of semiconductor device, too.

TABLE 1

| Lead length (mm) | Inductance (nH) (100 kHz) | | | | | |
|---|---|---|---|---|---|---|
| | Without Al | Al on one side | Al on upper, lower and side surfaces | | | |
| | | | 0 μm on side | 0.5 μm on side | 1 μm on side | 2 μm on side |
| 3 | 26 ± 3 | 19 ± 3 | 13 ± 3 | 12 ± 3 | 7 ± 3 | 6 ± 3 |
| 5 | 44 ± 3 | 31 ± 3 | 22 ± 3 | 21 ± 3 | 13 ± 3 | 11 ± 3 |
| 10 | 87 ± 3 | 62 ± 3 | 44 ± 3 | 42 ± 3 | 25 ± 3 | 21 ± 3 |
| 15 | 130 ± 3 | 93 ± 3 | 66 ± 3 | 63 ± 3 | 40 ± 3 | 32 ± 3 |
| 20 | 170 ± 3 | 120 ± 3 | 88 ± 3 | 85 ± 3 | 51 ± 3 | 42 ± 3 |
| 25 | 220 ± 3 | 160 ± 3 | 110 ± 3 | 105 ± 3 | 62.5 ± 3 | 53 ± 3 |

We claim:

1. A lead frame comprising a plate of a magnetic material defining leads each having top and bottom and side surfaces, and covering layers provided over the entire said top and bottom and both side surfaces of a portion of each of said leads which is to be sealed in a semiconductor package, said covering layers being made of a non-magnetic metal, and said layers being at least 1 micron thick at said side surfaces, thereby reducing the self-inductance of each of said leads.

2. A lead frame as claimed in claim 1, wherein said metal is aluminum or an aluminum alloy.

3. A lead frame as claimed in claim 1, wherein said metal is copper or a copper alloy.

4. A lead frame as claimed in claim 1, wherein said metal is gold or a gold alloy.

5. A lead frame as claimed in claim 1, wherein said metal is silver or a silver alloy.

6. A lead frame as claimed in claim 1, wherein said metal is zinc or a zinc alloy.

7. A lead frame as claimed in claim 1, wherein said metal is lead or a lead alloy.

8. A lead frame as claimed in claim 1, wherein said metal is tin or a tin alloy.

9. A lead frame as claimed in claim 1, wherein said magnetic material is an iron-nickel alloy of 38–55 percent by weight nickel or an iron-nickel-cobalt alloy of 25–35 percent by weight nickel and 15–25 percent by weight cobalt.

10. A lead frame as claimed in claim 1, wherein the length of said portion of each of said leads is at least 10 mm.

* * * * *